(12) United States Patent
Sato

(10) Patent No.: US 11,296,555 B2
(45) Date of Patent: Apr. 5, 2022

(54) POWER TRANSMISSION SYSTEM, LIGHT OUTPUT APPARATUS, AND LIGHT RECEIVING APPARATUS

(71) Applicant: Shunichi Sato, Miyagi (JP)

(72) Inventor: Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/819,444

(22) Filed: Mar. 16, 2020

(65) Prior Publication Data
US 2020/0303964 A1 Sep. 24, 2020

(30) Foreign Application Priority Data

Mar. 19, 2019 (JP) .............................. JP2019-052009
Feb. 28, 2020 (JP) .............................. JP2020-034337

(51) Int. Cl.
| | | |
|---|---|---|
| *H02J 50/30* | (2016.01) | |
| *H02J 50/90* | (2016.01) | |
| *H02J 50/40* | (2016.01) | |
| *H01S 5/40* | (2006.01) | |
| *H02S 20/32* | (2014.01) | |
| *H02J 50/80* | (2016.01) | |

(52) U.S. Cl.
CPC ............ *H02J 50/30* (2016.02); *H01S 5/4075* (2013.01); *H02J 50/402* (2020.01); *H02J 50/80* (2016.02); *H02J 50/90* (2016.02); *H02S 20/32* (2014.12); *H02J 2300/26* (2020.01)

(58) Field of Classification Search
CPC ....................................................... H02J 50/30
USPC ......................................................... 307/149
See application file for complete search history.

(56) References Cited

U.S. PATENT DOCUMENTS

| | | | | |
|---|---|---|---|---|
| 2016/0049831 | A1* | 2/2016 | Nakano | G01R 29/0878 |
| | | | | 307/104 |
| 2018/0136335 | A1* | 5/2018 | Kare | G01S 7/006 |
| 2020/0091778 | A1* | 3/2020 | Liao | H02J 50/12 |
| 2020/0227922 | A1* | 7/2020 | Bae | H02S 50/10 |

FOREIGN PATENT DOCUMENTS

| | | |
|---|---|---|
| JP | 2014-123712 | 7/2014 |
| JP | 2017-169369 | 9/2017 |

OTHER PUBLICATIONS

S. Fafard et al., "Ultrahign efficiencies in vertical epitaxial heterostructure architectures", Applied Physics Letters 108, 071101, Feb. 17, 2016.
(Continued)

*Primary Examiner* — Toan T Vu
*Assistant Examiner* — Dru Parries
(74) *Attorney, Agent, or Firm* — IPUSA, PLLC

(57) ABSTRACT

A power transmission system including a light output apparatus and a light receiving apparatus is provided. The light output apparatus includes a plurality of light sources having different wavelengths, and a light output control unit configured to control light outputs of the plurality of light sources, and the light receiving apparatus includes a photoelectric conversion element configured to absorb light beams emitted from the plurality of light sources, and convert the absorbed light beams into electrical power. The light output control unit individually sets each of the light outputs of the plurality of light sources.

19 Claims, 9 Drawing Sheets

(56) References Cited

OTHER PUBLICATIONS

Tomoyuki Miyamoto, "[Invited] Light power converter and emitting device required for optical power transmission technology", IEICE Technical' Report LQE2017-156 (2018), p. 23-26., with English Abstract.

Tatsuya Takamoto et al., "World's highest efficiency triple-junction solar cells fabricated by inverted layers transfer process" Solar Systems Development Group, SHART Corporation and Institute of Aerospace Technology, Japan Aerospace Exploration Agency (JAXA) (2010).

* cited by examiner

POWER TRANSMISSION SYSTEM, LIGHT OUTPUT APPARATUS, AND LIGHT RECEIVING APPARATUS

CROSS-REFERENCE TO RELATED APPLICATIONS

The present application claims priority under 35 U.S.C. § 119 to Japanese Patent Application No. 2019-052009, filed on Mar. 19, 2019, and Japanese Patent Application No. 2020-034337, filed on Feb. 28, 2020, the entire contents of which are incorporated herein by reference.

BACKGROUND OF THE INVENTION

1. Field of the Invention

The disclosures herein relate to a power transmission system, a light output apparatus, and a light receiving apparatus.

2. Description of the Related Art

In recent years, while data communication for telephones (such as mobile phones and smartphones) and computers is performed wirelessly, power transmission is still performed through wired connection in most cases. As a wireless power transmission technology, an electromagnetic induction technology is known. However, the electromagnetic induction technology has some problems, such as the amount of electrical power supplied, a transmission distance, the alignment of a power transmitter and a power receiver, the size of a system, safety to human bodies due to leakage of electromagnetic waves, and electromagnetic interference to devices. In light of the above, a wireless power transmission technology that supplies electrical power by irradiating a solar cell (a light receiving element) with light beams (such as laser light) has been examined. Power transmission using light beams allows the power to be transmitted over a long distance without being affected by radio frequency.

As a light receiving element that converts optical energy into electrical energy, a solar cell, which serves as a photoelectric conversion cell, has been widely used. As sunlight has a broad spectrum ranging from ultraviolet to infrared, it may be difficult for such photoelectric conversion cells to efficiently convert optical energy into electrical energy. Conversely, in wireless power transmission, band gaps of photoelectric conversion cells and wavelengths of light sources can be appropriately selected. Thus, higher energy conversion efficiency is expected to be achieved.

Patent Document 1 describes an electrical power transmission system including a power transmitting apparatus and a power receiving apparatus. The power transmitting apparatus converts electrical power into light and emits the light toward the power receiving apparatus, and the power receiving apparatus converts the received light into electrical power. In this way, electrical power is transmitted from the power transmitting apparatus to the power receiving apparatus. The electrical power transmission system described in Patent Document 1 uses light sources of a plurality of wavelengths, and also uses a multi-junction solar cell in which photoelectric conversion cells made of different materials having different band gaps are connected in series.

However, in a case where a multi-junction solar cell is used as a power receiving apparatus, highly-efficient transmission of electrical power may be difficult depending on the intensities of emitted light beams of a plurality of wavelengths.

RELATED-ART DOCUMENTS

Patent Documents

Patent Document 1: Japanese Unexamined Patent Application Publication No. 2017-169369

Non-Patent Documents

Non-Patent Document 1: S. Fafard, M. C. A. York, F. Proulx, C. E. Valdivia, M. M. Wilkins, R. Ares, V. Aimez, K. Hinzer, and D. P. Masson, "Ultrahigh efficiencies in vertical epitaxial heterostructure architectures", Applied Physics Letters 108, 071101 (2016).

SUMMARY OF THE INVENTION

According to an embodiment of the present invention, a power transmission system including a light output apparatus and a light receiving apparatus is provided. The light output apparatus includes a plurality of light sources having different wavelengths, and a light output control unit configured to control light outputs of the plurality of light sources, and the light receiving apparatus includes a photoelectric conversion element configured to absorb light beams emitted from the plurality of light sources, and convert the absorbed light beams into electrical power. The light output control unit individually sets each of the light outputs of the plurality of light sources.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
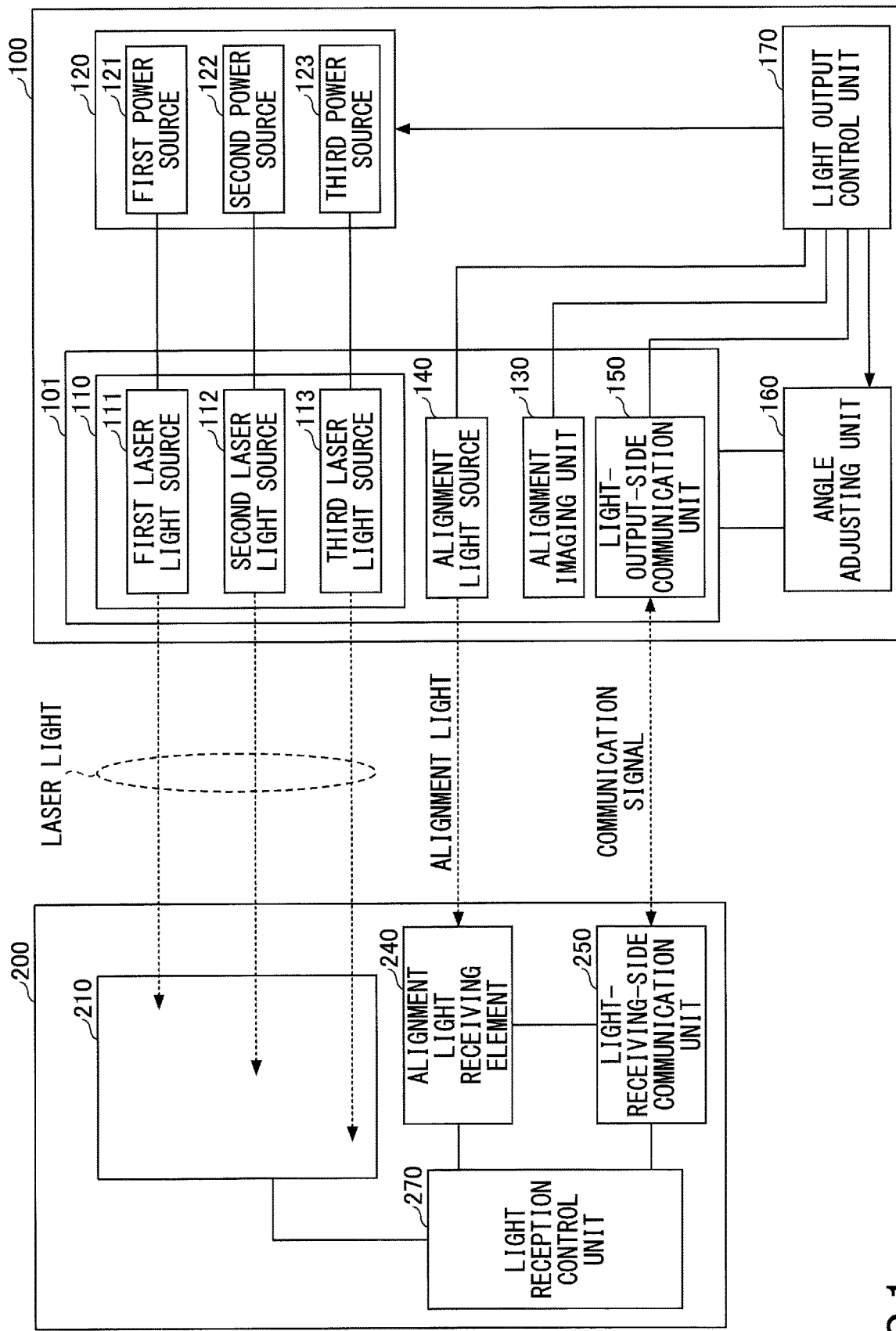
FIG. 1 is a configuration diagram illustrating a power transmission system according to a first embodiment.

According to an embodiment of the present invention, a power transmission system enables highly-efficient transmission of electrical power from a light output apparatus to a light receiving apparatus.

In the following, embodiments of the present invention will be described with reference to the accompanying drawings. The same elements are denoted by the same reference numerals, and a duplicate description thereof will be omitted.

First Embodiment (Power Transmission System)

A power transmission system according to a first embodiment will be described. The power transmission system according to the first embodiment is an optical wireless power transmission system that uses light to transmit electrical power without using transmission lines. The power transmission system according to the first embodiment includes a light output apparatus 100 and a light receiving apparatus 200. The light output apparatus 100 converts electrical power into light, and emits the converted light toward the light receiving apparatus 200. The light receiving apparatus 200 receives the light emitted from the light output apparatus 100, and converts the received light into electrical power. Accordingly, even when the light output apparatus 100 and the light receiving apparatus 200 are located apart from each other, electrical power can be transmitted from the light output apparatus 100 to the light receiving apparatus 200 without using transmission lines.

(Light Output Apparatus)

First, the light output apparatus 100 according to the first embodiment will be described. The light output apparatus 100 includes a light output unit 110, a power source unit 120, an alignment imaging unit 130, an alignment light source 140, a light-output-side communication unit 150, an angle adjusting unit 160, and a light output control unit 170.

The light output unit 110 includes a first laser light source 111, a second laser light source 112, and a third laser light source 113. In the first embodiment, the first laser light source 111 is formed by a semiconductor laser having a wavelength of 653 nm (1.90 eV). The second laser light source 112 is formed by a semiconductor laser having a wavelength of 873 nm (1.42 eV). The third laser light source 113 is formed by a semiconductor laser having a wavelength of 1060 nm (1.17 eV). Because the semiconductor lasers are small, the size of the system can be reduced.

The power source unit 120 includes a first power source 121, a second power source 122, and a third power source 123. The first power source 121 supplies electrical power to the first laser light source 111. The second power source 122 supplies electrical power to the second laser light source 112. The third power source 123 supplies electrical power to the third laser light source 113.

The alignment imaging unit 130 captures an image to check the position of the light receiving apparatus 200. The alignment light source 140 emits laser light toward the light receiving apparatus 200 to adjust the position of the light receiving apparatus 200. The light-output-side communication unit 150 is a transmitting/receiving device that performs data communication with a light-receiving-side communication unit 250 of the light receiving apparatus 200.

The angle adjusting unit 160 adjusts the angle of a light-output-side emission unit 101. The light-output-side emission unit 101 includes the light output unit 110, the alignment imaging unit 130, the alignment light source 140, and the light-output-side communication unit 150. Accordingly, the angle of laser light emitted from the light output unit 110 can be adjusted by the angle adjusting unit 160.

The light output control unit 170 controls the first power source 121, the second power source 122, and the third power source 123 of the power source unit 120, while also controlling the alignment light source 140, the light-output-side communication unit 150, and the angle adjusting unit 160. The light output control unit 170 is connected to the alignment imaging unit 130, and an image captured by the alignment imaging unit 130 is transmitted to the light output control unit 170.

(Light Receiving Apparatus)

Next, the light receiving apparatus 200 according to the first embodiment will be described. The light receiving apparatus 200 includes a light receiving unit 210, an alignment light receiving element 240, the light-receiving-side communication unit 250, and a light reception control unit 270. The alignment light receiving element 240 receives laser light emitted from the alignment light source 140 of the light output apparatus 100. The light-receiving-side communication unit 250 is a transmitting/receiving device that performs data communication with the light-output-side communication unit 150 of the light output apparatus 100.

Figure 2:
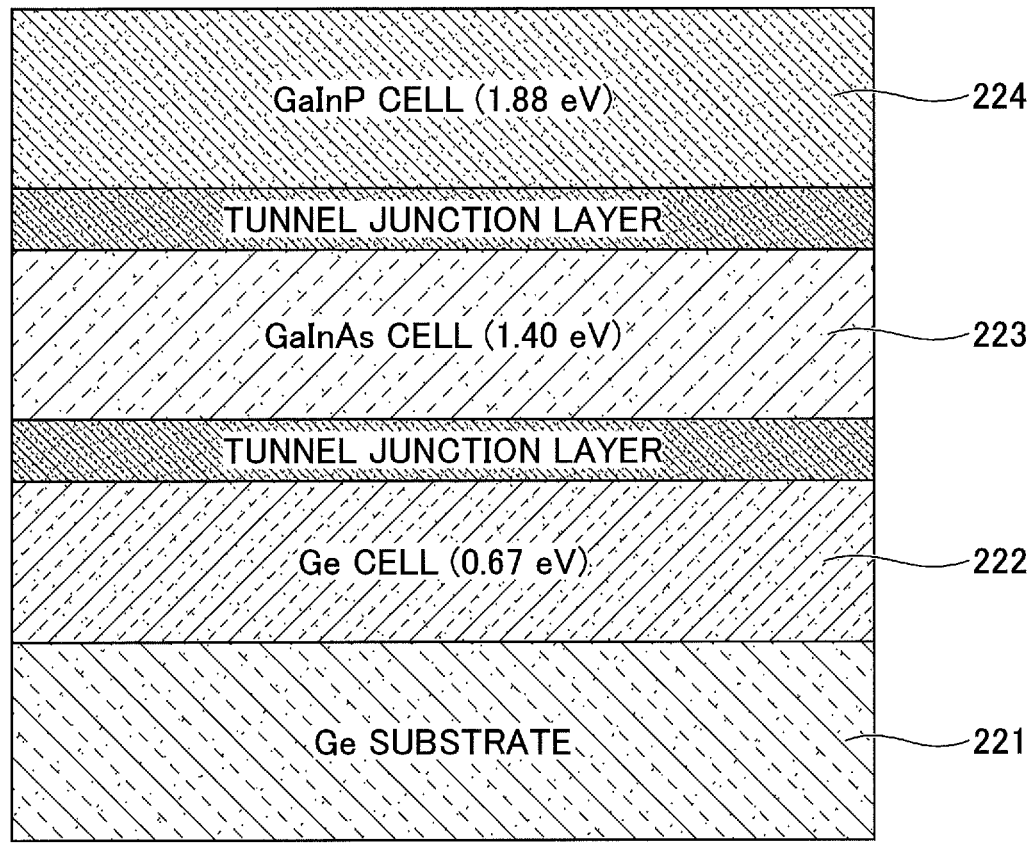
FIG. 2 is a configuration diagram illustrating a photoelectric conversion element according to the first embodiment.

The light receiving unit 210 includes a photoelectric conversion element, which is what is known as a multi-junction solar cell. In the first embodiment, the light receiving unit 210 includes a photoelectric conversion element 220 as illustrated in FIG. 2. In the photoelectric conversion element 220, a Ge cell (0.67 eV) 222, a GaInAs cell (1.40 eV) 223, a GaInP cell (1.88 eV) 224 are sequentially stacked on a Ge substrate 221. Further, a tunnel junction layer is formed between the Ge cell 222 and the GaInAs cell 223. In addition, a tunnel junction layer is formed between the GaInAs cell 223 and the GaInP cell 224. The photoelectric conversion element 220 illustrated in FIG. 2 is a triple-junction solar cell including three cells, the Ge cell 222, the GaInAs cell 223, and the GaInP cell 224.

In such a multi-junction solar cell, photoelectric conversion cells having different band gaps are connected via tunnel junction layers, and the photoelectric conversion cells receive respective light beams having different wavelengths.

Compound semiconductors have different levels of band gap energy and lattice constants in accordance with the material composition. Therefore, a multi-junction solar cell, which divides absorption wavelength ranges and increases energy conversion efficiency, can be produced. At present, a typical example of a multi-junction solar cell that receives sunlight is a triple-junction solar cell including lattice matching GaInP/GaInAs/Ge cells (having band gaps of 1.88 eV/1.40 eV/0.67 eV) formed on a Ge substrate, which has a lattice constant approximately the same as that of GaAs. The conversion efficiency of a compound semiconductor solar cell is approximately two times higher than that of a silicon (Si)-based solar cell.

The balance of the band gaps of the above-described lattice-matching triple-junction solar cell using the Ge substrate is not optimum for a solar cell that receives sunlight, in terms of current balance. In the above-described triple-junction solar cell, increasing the band gap of the cell having the smallest band gap is desirable. Further, as an example of high efficiency, there is a triple-junction solar cell consisting of a GaInP cell, a GaAs cell, and a GaInAs cell (having band gaps of 1.9 eV, 1.42 eV, and 1.0 eV).

Solar cells that receive sunlight are designed to efficiently receive sunlight over a broad wavelength range. In the case of power transmission using laser light according to the first embodiment, each photoelectric conversion cell receives light of a corresponding wavelength. Even if light of a wavelength having energy larger than the band gap of a photoelectric conversion cell is received, the difference in energy is converted into heat and is not converted into electrical power. As the wavelength approaches the band gap, the absorption coefficient decreases, and further, light having a wavelength longer than that corresponding to the band gap is transmitted. Accordingly, by appropriately setting the band gaps of solar cell materials, energy conversion efficiency increases. Specifically, the energy of light for power transmission is preferably equal to, or is greater than and close to the band gap of the material of a photoelectric conversion cell that constitutes a solar cell for power reception.

In the first embodiment, laser beams of a plurality of respective wavelengths are emitted from the laser light sources. Further, the photoelectric conversion cells of the photoelectric conversion element have band gaps that allow the photoelectric conversion cells to efficiently absorb laser beams of the respective wavelengths. In order for a photoelectric conversion cell to sufficiently absorb a laser beam of a corresponding wavelength, the thickness of the photoelectric conversion cell, which serves as a light absorbing layer, is set to a desired thickness so as to prevent the laser beam from being transmitted through the photoelectric conversion cell and absorbed in a lower-side photoelectric conversion cell. In this way, it is possible to prevent light from being transmitted through a target photoelectric conversion cell (in which the light is expected to be absorbed) and being absorbed in a lower-side photoelectric conversion cell having a smaller band gap. As a result, an increase in energy loss can be avoided.

In a multi-junction solar cell, because cells are connected in series, the same amount of current flows in each of the cells. It is preferable for the light sources to emit light beams in amounts that allow the cells to output the same amount of current. Even if the amount of a light beam emitted to one of the cells is increased, the output current would not increase, and such power would be wasted. By preliminarily obtaining the relationship between the light amounts of respective wavelengths and the current amounts generated in the respective photoelectric conversion cells, it is possible to identify light outputs of the light sources at which current amounts generated in the photoelectric conversion cells become the same. Therefore, it is possible to adjust the current amounts generated in the respective photoelectric conversion cells by adjusting the light amounts of the light sources having the respective wavelengths. Accordingly, it is possible to readily set conditions in which current amounts generated in the photoelectric conversion cells become the same. As a result, it is possible to reduce light converted into heat and thus wasted, thereby providing a highly efficient power transmission system.

As described above, each of the photoelectric conversion cells absorbs a light beam of a corresponding wavelength. Therefore, currents generated in the photoelectric conversion cells are readily matched by adjusting the light outputs of the light sources, which correspond to the respective photoelectric conversion cells of the multi-junction solar cell. Note that the power transmission system may be configured to emit laser beams of a plurality of wavelengths to one photoelectric conversion cell, or may include a plurality of light sources having the same wavelength.

Further, the light sources may be any devices that emit light of wavelengths that can be absorbed in the light receiving apparatus. Any light sources such as light emitting diodes (LED) may be used, other than the semiconductor lasers.

(Power Transmission Method Performed by Power Transmission System)

Next, a power transmission method performed by the power transmission system according to the present embodiment will be described. First, the alignment imaging unit 130 of the light output apparatus 100 captures an image to identify and locate the position of the light receiving apparatus 200, and the angle adjusting unit 160 adjusts the emission direction of the alignment light source 140. Next, the alignment light source 140 emits light toward the alignment light receiving element 240 in an eye-safe manner. The light emitted from the alignment light source 140 is preferably near infrared light with a wavelength of 940 nm or 1.5 µm. The image captured by the alignment imaging unit 130 and the light emitted from the alignment light source 140 may also be used to check whether there is a person or an obstacle between the light output apparatus 100 and the light receiving apparatus 200.

When the alignment light receiving element 240 of the light receiving apparatus 200 receives the light emitted from the alignment light source 140 of the light output apparatus 100, the alignment light receiving element 240 outputs an output current corresponding to the amount of the received light. Information on the output current is transmitted from the light-receiving-side communication unit 250 of the light receiving apparatus 200 to the light-output-side communication unit 150 of the light output apparatus 100. The light output control unit 170 of the light output apparatus 100 monitors the output current, output from the alignment light receiving element 240 of the light receiving apparatus 200, based on the information received by the light-output-side communication unit 150. Accordingly, the light output control unit 170 monitors the output current of the alignment light receiving element 240, and the angle adjusting unit 160 adjusts the direction of light emitted from the alignment light source 140 so as to maximize the output current of the alignment light receiving element 240. In this way, while the emission direction of laser light is being adjusted, the laser light is emitted from the light output unit 110 of the light output apparatus 100, is received by the light receiving unit 210 of the light receiving apparatus 200, and is converted into electrical power, thereby achieving power transmission from the light output apparatus 100 to the light receiving apparatus 200. During power transmission from the light output apparatus 100 to the light receiving apparatus 200, the direction of light emitted from the alignment light source is adjusted through communication between the light-output-side communication unit 150 of the light output apparatus 100 and the light-receiving-side communication unit 250 of the light receiving apparatus 200. The light output control unit 170 controls the angle adjusting unit 160 to adjust the emission direction of light.

Further, during power transmission from the light output apparatus 100 to the light receiving apparatus 200, the light output control unit 170 continuously controls light outputs of the laser light sources of the light output unit 110, so as to maximize the amount of current obtained in the photoelectric conversion element 220. That is, information of the amount of current obtained in the photoelectric conversion element 220 is transmitted to the light output control unit 170 via the light-receiving-side communication unit 250 and the light-output-side communication unit 150. Then, the light output control unit 170 controls the power source unit 120, so as to maximize the amount of current obtained in the photoelectric conversion element 220.

In the present embodiment, a feedback mechanism is provided, in which the amount of current obtained in the photoelectric conversion element 220 is monitored, and light outputs of the laser light sources of the light output unit 110 are finely adjusted so as to maximize the amount of current. With the feedback mechanism, even if currents are mismatched due to environmental changes or changes over time between the light output apparatus 100 and the light receiving apparatus 200, optimal power transmission can be achieved. Accordingly, the power transmission system enabling high energy transmission efficiency can be provided.

Further, adjustments through current matching can be readily performed at a later time. Therefore, even if there are some variations in thickness or composition in a multi-junction solar cell, which is the photoelectric conversion element 220, the power transmission system can use such a multi-junction solar cell by making adjustments through current matching. Specifically, for example, the amount of light emitted from each of the laser light sources of the light output unit 110 of the light output apparatus 100 is sequentially adjusted, namely slightly changed, so as to maximize the amount of current flowing in the photoelectric conversion element 220 of the light receiving apparatus 200. In this way, the light output apparatus 100 can be optimized on a per-system basis. Accordingly, even if there are some variations in manufactured photoelectric conversion elements, such photoelectric conversion elements can be used in light output apparatuses, thereby improving the manufacturing yield of photoelectric conversion elements.

In the present embodiment, the multi-junction solar cell is used as the photoelectric conversion element 220, and an output voltage is increased by decreasing an output current. The amount of heat generated is represented by $I^2R$ (I=current, R=resistance). Therefore, it is possible to reduce energy that is lost due to heat without being converted into electrical power.

In the present embodiment, even if light with higher energy density is emitted, power can be transmitted without a decrease in efficiency. Further, even if a light receiving area is small, large electrical power can be transmitted. A typical solar cell receives sunlight of 1 sun (1 kW/m$^2$), which is the standard sunlight intensity, and converts to electrical power. For power transmission, it is preferable to convert light into large electrical power by using a small light receiving area. Accordingly, the power transmission system preferably emits light with energy density greater than or equal to 1 sun (1 kW/m$^2$).

Further, in the multi-junction solar cell, which is the photoelectric conversion element 220, the energy conversion efficiency increases by increasing the optical density of light emitted to the solar cell. That is, the energy conversion efficiency increases by increasing the open-circuit voltage (Voc). The energy conversion efficiency is expressed by the following equation.

$$\text{Energy conversion efficiency} = Jsc \cdot Voc \cdot FF/Pin$$

In the equation above, Jsc is the short-circuit current density (current at zero voltage), Voc is the open-circuit voltage (voltage at zero current), FF is the fill factor (a measure of the squareness of the current-voltage (I-V) curve), and Pin is the incident light power.

For typical solar cells such as Si solar cells, if light with energy density equal to 10 suns (10 kW/m$^2$), which is 10 times natural sunlight, is emitted, the power conversion efficiency would decrease, although it depends on the series resistance value. Conversely, for a multi-junction solar cell, even if light with energy density equal to 10 suns or even 100 suns (100 kW/m$^2$) is emitted, the multi-junction solar cell can generate power by lowering the series resistance value without a reduction in efficiency. Examples of such multi-junction solar cells include a triple-junction solar cell consisting of GaInP (1.88 eV), GaInAs (1.40 eV), and Ge (0.67 eV).

Accordingly, in such a multi-junction solar cell, by increasing band gaps of photoelectric conversion cells and decreasing the amount of current for power generation, and by increasing the number of photoelectric conversion cells (junctions) and decreasing the amount of current for power generation, it is possible to achieve power transmission without a reduction in conversion efficiency even if light exceeding 100 suns is emitted. Accordingly, in the present embodiment, the energy density of light is preferably 10 kW/m$^2$ or more, and more preferably 100 kW/m$^2$ or more. Further, in order to reduce effects of heat as much as possible and increase the optical density, a heat dissipation structure such as a heat sink is preferably provided.

Further, in the present embodiment, the light output unit 110 of the light output apparatus 100 includes the plurality of laser light sources, but the light output unit 110 may include a plurality of light emitting diodes (LEDs). However, for solar cells, the conversion efficiency depends on the wavelength of light. In addition, as compared to light emitting diodes, wavelength stability of semiconductor lasers is high, and thus a desired wavelength can be set by controlling the material composition, and also semiconductor lasers have high energy conversion efficiency and are compact. For this reason, the light output unit 110 of the light output apparatus 100 uses the plurality of semiconductor lasers.

Figure 3:
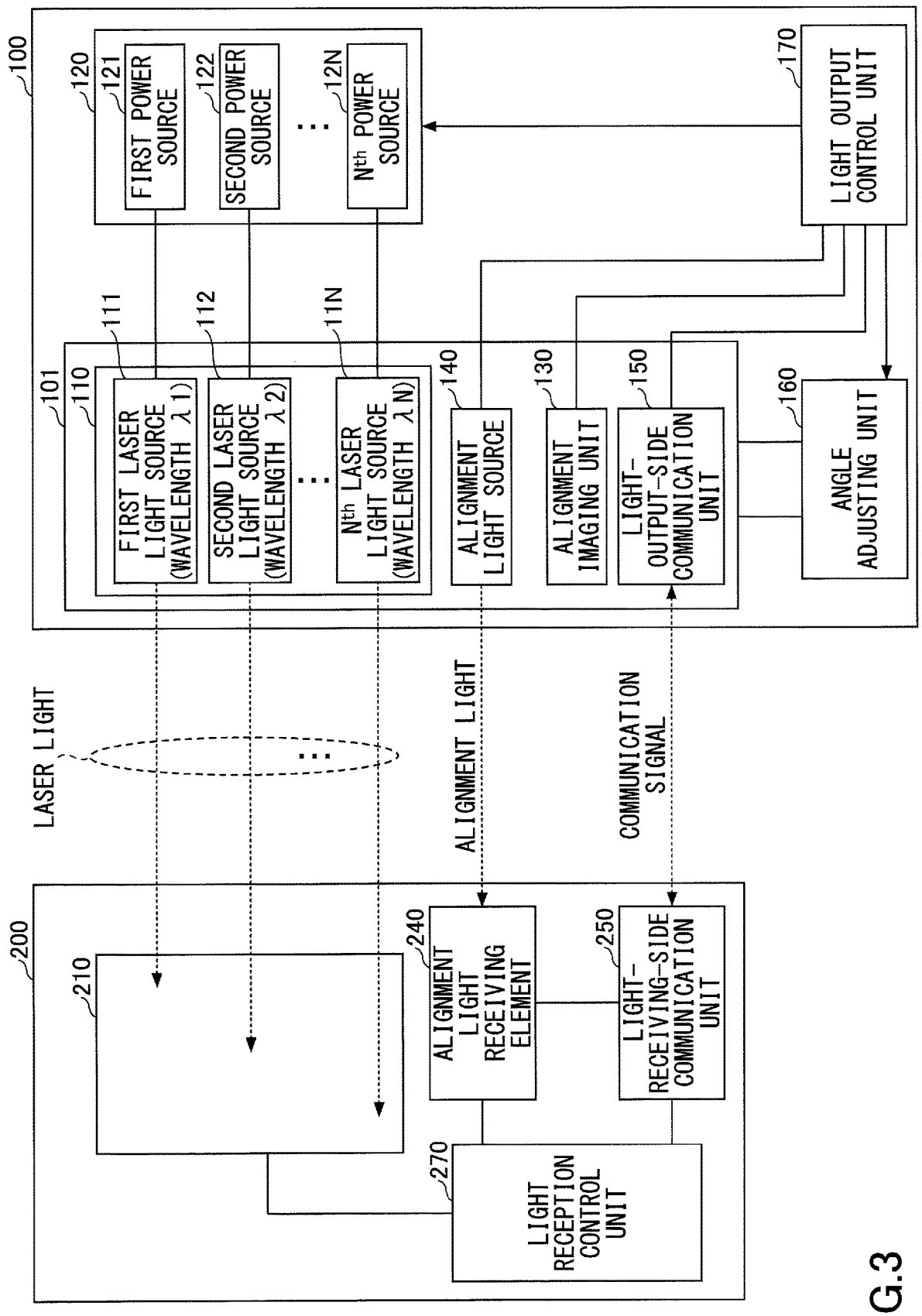
FIG. 3 is a configuration diagram illustrating a variation of the power transmission system according to the first embodiment.

Further, in the above-described example, the three semiconductor lasers are used in the light output unit 110 of the light output apparatus 100. However, two semiconductor lasers may be used, or N number of (more than three) semiconductor lasers may be used. Specifically, as illustrated in FIG. 3, the light output unit 110 of the light output apparatus 100 may include the first laser light source 111 having a wavelength λ1, the second laser light source 112 having a wavelength λ2, . . . and the N$^{th}$ laser light source 11N having a wavelength λN. In this case, the power source unit 120 includes the N number of power sources. Specifically, the power source unit 120 includes the first power source 121, the second power source 122, and the N$^{th}$ power source 12N. The first power source 121 supplies electrical power to the first laser light source 111. The second power source 122 supplies electrical power to the second laser light source 112. The N$^{th}$ power source 12N supplies electrical power to the N$^{th}$ laser light source 11N.

(Current Matching Method During Power Transmission)

Figure 4:
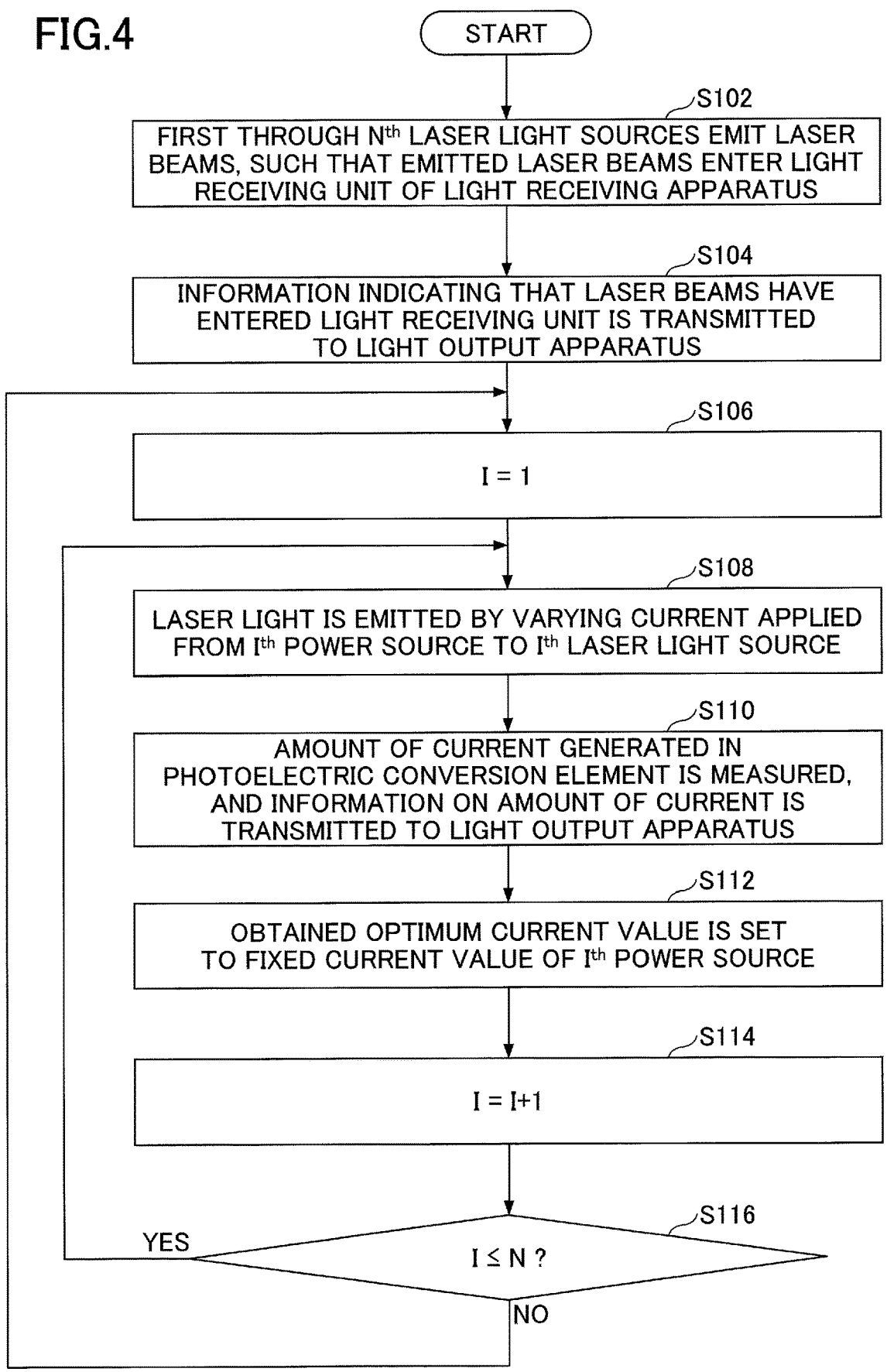
FIG. 4 is a flowchart of current matching performed by the power transmission system according to the first embodiment.

Next, a current matching method performed during power transmission by the power transmission system according to the present embodiment will be described with reference to FIG. 4.

First, in step 102 (S102), upon currents being applied to the first laser light source through the N$^{th}$ laser light source, the first laser light source through the N$^{th}$ laser light source emit laser beams to the light receiving unit 210 of the light receiving apparatus 200, such that the emitted laser beams enter the light receiving unit 210 of the light receiving apparatus 200. Specifically, the first power source through the $N^{th}$ power source apply currents to the first laser light source through the $N^{th}$ laser light source, in such a manner that laser beams are output from the first laser light source through the $N^{th}$ laser light source at predetermined levels. Upon receiving the currents, the first laser light source through the $N^{th}$ laser light source emit laser beams to the light receiving unit 210 of the light receiving apparatus 200, such that the emitted laser beams enter the light receiving unit 210. The laser beams that have entered the light receiving unit 210 are monitored by the light receiving unit 210, and the amount of current is measured.

Next, in step 104 (S104), information indicating that the laser beams have entered the light receiving unit 210 is transmitted to the light output apparatus 100 via the communication unit 250 and the light-output-side communication unit 150. Specifically, the information indicates that the laser beams, emitted from the first laser light source through the $N^{th}$ laser light source, have entered the light receiving unit 210 of the light receiving apparatus 200.

Next, in step 106 (S106), a value I is set to 1.

Next, in step 108 (S108), in the light output apparatus 100, a current applied from the $I^{th}$ power source to the $I^{th}$ laser light source is varied.

Next, in step 110 (S110), the amount of current output from the photoelectric conversion element 220 of the light receiving unit 210 is measured, and information on the measured current amounts is transmitted to the light output apparatus 100.

Next, in step 112 (S112), an optimum current value, which has been obtained by varying the current applied from the $I^{th}$ power source to the $I^{th}$ laser light source, is set to a fixed current value of the $I^{th}$ power source. Specifically, while increasing and decreasing the current applied from the $I^{th}$ power source to the $I^{th}$ laser light source, the amount of current output from the photoelectric conversion element 220 is monitored. Then, information on the amount of current output from the photoelectric conversion element 220 is transmitted to the light output apparatus 100. The light output control unit 170 selects, as an optimum current value, the lowest current value from among current values of the $I^{th}$ power source at which the amount of current output from the photoelectric conversion element 220 is maximized, and sets the optimum current value to a fixed current value of the $I^{th}$ power source. Even if power of laser light exceeding a certain level enters the photoelectric conversion element 220, the amount of current output from the photoelectric conversion element 220 would not increase, and the power of the laser light exceeding the certain level would be wasted. Therefore, by performing the above-described steps, energy loss can be reduced.

Next, in step 114 (S114), 1 is added to the value of I.

Next, in step 116 (S116), it is determined whether the value of I is greater than or equal to N. When it is determined that the value of I is greater than or equal to N, the process proceeds to step 108. When it is determined that the value of I is not greater than or equal to N, the process returns to step 106, and the above steps are repeated.

The above-described current matching is performed until power transmission ends.

Note that, at the time of inspection of the photoelectric conversion element 220 before the above-described current matching is performed, it is preferable to check light outputs of laser light sources at which current amounts generated in photoelectric conversion cells become the same. Further, the order of the laser light sources for current matching is not limited to the above.

Further, instead of the light output control unit 170, the light reception control unit 270 may determine an optimum current value. In this case, information on the optimum current value is transmitted from the light receiving apparatus 200 to the light output apparatus 100 via the light-receiving-side communication unit 250 and the light-output-side communication unit 150.

Further, light entering the photoelectric conversion element 220 is not limited to laser light emitted from the light output unit 110 of the light output apparatus 100. Ambient light such as sunlight may enter the photoelectric conversion element 220. In this case, current matching can also be performed by a method similar to the above-described method.

(Application Example of Power Transmission System)

Currently, the use of unmanned drones for postal and home delivery services is under consideration. Such unmanned drones are driven by electrical power from rechargeable batteries. Specifically, the creation of drone highways along power transmission lines and the creation of aqua skyways along rivers have been studied. Electrical power from a rechargeable battery allows a drone to fly only approximately 30 minutes, and the battery is required to be recharged on the way. Further, in the case of an electromagnetic induction type charging system, battery charging takes time, and drones are required to be located near the charging system, thus making it difficult to efficiently perform postal and home delivery services.

Conversely, in the power transmission system according to the present embodiment, a battery can be recharged while a drone is flying. That is, power can be transmitted to a drone during postal delivery and home delivery. Thus, postal delivery and home delivery services can be efficiently performed without disruption.

Non-Patent Document 1 describes a multi-junction solar cell in which a plurality of photoelectric conversion cells having the same absorption wavelength are stacked. In the multi-junction solar cell described in Non-Patent Document 1, the photoelectric conversion cells are connected in series, and thus, the total voltage is equal to the sum of voltages of the photoelectric conversion cells, but the current is the same for all the photoelectric conversion cells. Therefore, the current of the multi-junction solar cell described in Non-Patent Document 1 is limited by the lowest current value. With this configuration, light of the same wavelength is absorbed in each of the photoelectric conversion cells. However, light is absorbed in order from the incident-side photoelectric conversion cell. Thus, in order for the photoelectric conversion cells to generate the same current amount, the photoelectric conversion cells, serving as light absorbing layers, would need to be thicker toward the substrate. However, adjusting the thicknesses of the light absorbing layers is not easy, and inappropriate thicknesses would result in poor current balance, thus making it difficult to achieve current matching. Further, the optimum structure also depends on the output of incident light. Thus, it would be difficult to produce a system that uses a multi-junction solar cell to convert light of a single wavelength into electrical power. Conversely, in the power transmission system according to the present embodiment, the photoelectric conversion cells have band gaps corresponding to respective wavelengths, and absorb light beams of the respective wavelengths. In addition, the power transmission system according to the present embodiment can individually set each output of a light beam of a corresponding wavelength. Accordingly, it is possible to produce a highly efficient optical wireless power transmission system with high uniformity and reproducibility.

Second Embodiment

Next, a second embodiment will be described. In a power transmission system according to the second embodiment, wavelengths of laser light sources included in the light output unit 110 of the light output apparatus 100 and also the structure of a photoelectric conversion element are different from those of the first embodiment.

Specifically, the power transmission system according to the second embodiment includes a light output apparatus that outputs light beams of short wavelengths and a photoelectric conversion element that has high energy band gaps. The power transmission system uses the above-described light output apparatus and photoelectric conversion element to increase the output voltage. In the second embodiment, the first laser light source 111 is formed by a semiconductor laser having a wavelength of 640 nm (1.94 eV). The second laser light source 112 is formed by a semiconductor laser having a wavelength of 681 nm (1.82 eV). The third laser light source 113 is formed by a semiconductor laser having a wavelength of 850 nm (1.46 eV).

Figure 5:
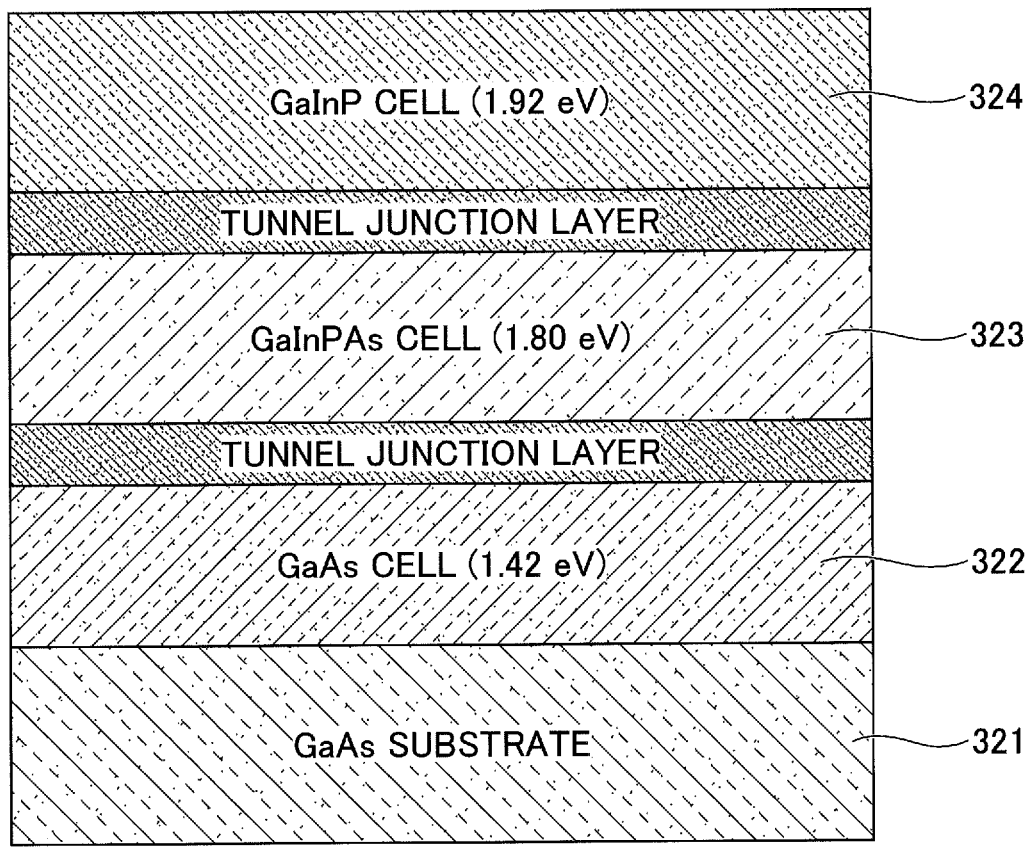
FIG. 5 is a configuration diagram illustrating a photoelectric conversion element according to a second embodiment.

Further, in the second embodiment, the light receiving unit 210 includes a photoelectric conversion element 320 as illustrated in FIG. 5. In the photoelectric conversion element 320, a GaAs cell (1.42 eV) 322, a GaInPAs cell (1.80 eV) 323, and a GaInP cell (1.92 eV) 324 are sequentially stacked on a GaAs substrate 321. Further, a tunnel junction layer is formed between the GaAs cell 322 and the GaInPAs cell 323. In addition, a tunnel junction layer is formed between the GaInPAs cell 323 and the GaInP cell 324. Further, instead of GaInPAs, AlGaAs may be used for the cell 323.

The output voltage of a solar cell becomes lower than the band gap of a light absorbing layer by approximately 0.3 V to 0.5 V. In the second embodiment, the output voltage of the photoelectric conversion element 320 becomes lower than the band gap of a light absorbing layer forming each photoelectric conversion cell by approximately 0.3 V to 0.5 V. Therefore, a larger band gap is favorable in terms of efficiency. Preferred band gaps are band gaps of AlGaInN-based materials. However, it would be difficult to form a lattice matching photoelectric conversion cell with the AlGaInN-based materials. For GaAs-based materials, although band gaps of the GaAs-based materials are not as large as those of the AlGaInN-based materials, a lattice matching photoelectric conversion cell can be readily formed. Therefore, in the case of a GaAs substrate, a multi-junction solar cell may be formed by using materials having band gaps larger than GaAs (1.42 eV), and in the case of a Ge substrate, a multi-junction solar cell may be formed by using materials having band gaps larger than GaInAs (1.40 eV) that are lattice matched to Ge, thereby enabling highly efficient power transmission.

In the second embodiment, the photoelectric conversion element 320 has been described as a triple-junction solar cell including the GaAs cell (1.42 eV) 322, the GaInPAs cell (1.80 eV) 323, and the GaInP cell (1.92 eV) 324; however, the present invention is not limited thereto. In the photoelectric conversion element 320, band gaps of photoelectric conversion cells and the number of photoelectric conversion cells may be appropriately set. In addition, in the light output unit 110 of the light output apparatus 100, wavelengths of laser light sources may also be appropriately set.

Details other than the above are similar to those of the first embodiment.

Third Embodiment

Next, a third embodiment will be described. In a power transmission system according to the third embodiment, wavelengths of laser light sources included in the light output unit 110 of the light output apparatus 100 and also the structure of a photoelectric conversion element are different from those of the first embodiment.

Specifically, in the third embodiment, the light output unit 110 of the light output apparatus 100 includes six laser light sources having different wavelengths. That is, the light output unit 110 includes a first laser light source, a second laser light source, a third laser light source, a fourth laser light source, a fifth laser light source, and a sixth laser light source.

The first laser light source is formed by a semiconductor laser having a wavelength of 639 nm (1.94 eV). The second laser light source is formed by a semiconductor laser having a wavelength of 674 nm (1.84 eV). The third laser light source is formed by a semiconductor laser having a wavelength of 713 nm (1.74 eV). The fourth laser light source is formed by a semiconductor laser having a wavelength of 756 nm (1.64 eV). A fifth laser light source is formed by a semiconductor laser having a wavelength of 805 nm (1.54 eV). The sixth laser light source is formed by a semiconductor laser having a wavelength of 861 nm (1.44 eV). In the third embodiment, the light output unit 110 of the light output apparatus 100 includes the six laser light sources having the above-described respective wavelength. Note that all the six laser light sources, namely the first laser light source, the second laser light source, the third laser light source, the fourth laser light source, the fifth laser light source, and the sixth laser light source can be formed on a GaAs substrate.

Figure 6:
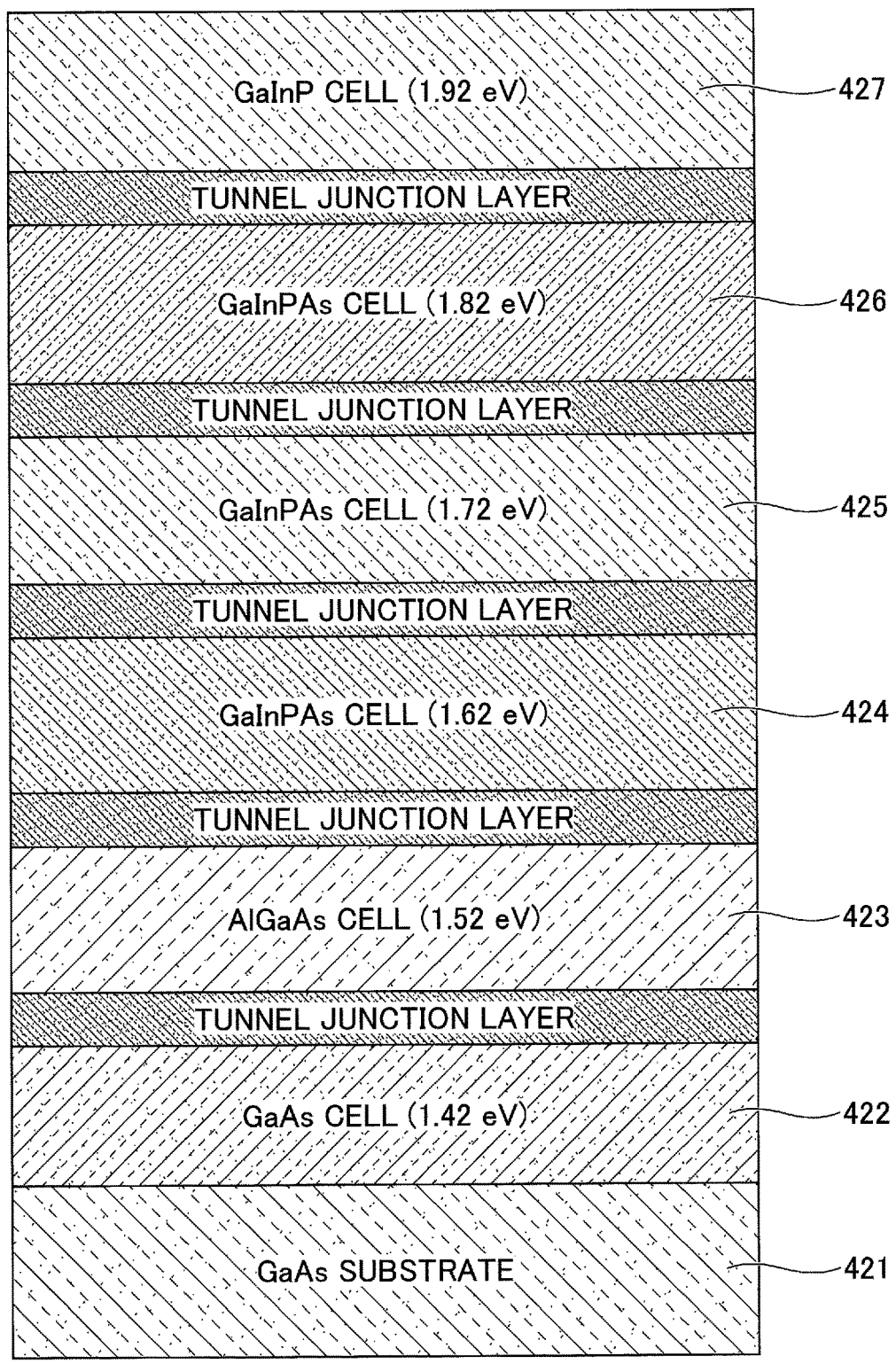
FIG. 6 is a configuration diagram illustrating a photoelectric conversion element according to a third embodiment.
Figure 7:
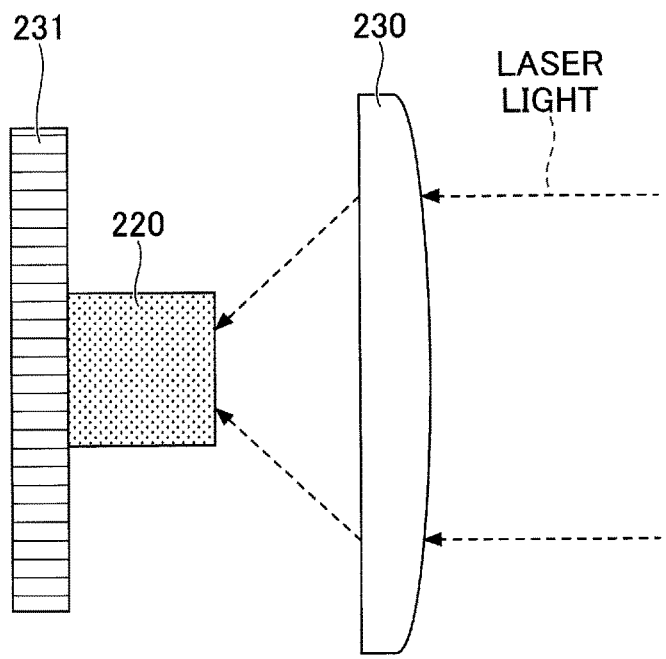
FIG. 7 is a diagram illustrating a light receiving unit of a power transmission system according to a fourth embodiment.

Further, in the third embodiment, the light receiving unit 210 includes a photoelectric conversion element 420. The photoelectric conversion element 420 is a sextuple-junction solar cell as illustrated in FIG. 6. In the photoelectric conversion element 420, a GaAs cell (1.42 eV) 422, an AlGaAs cell (1.52 eV) 423, a GaInPAs cell (1.62 eV) 424, a GaInPAs cell (1.72 eV) 425, a GaInPAs cell (1.82 eV) 426, and a GaInP cell (1.92 eV) 427 are sequentially formed on a GaAs substrate 421. Further, a tunnel junction layer is formed between the GaAs cell 422 and the AlGaAs cell 423. A tunnel junction layer is formed between the AlGaAs cell 423 and the GaInPAs cell 424. A tunnel junction layer is formed between the GaInPAs cell 424 and the GaInPAs cell 425. A tunnel junction layer is formed between the GaInPAs cell 425 and the GaInPAs cell 426. A tunnel junction layer is formed between the GaInPAs cell 426 and the GaInP cell 427. Note that GaInPAs may be used for the cell 423, and AlGaAs may be used for the cells 424, 425, and 426.

In the third embodiment, the six laser light sources having respective wavelengths are included in the light output unit 110 of the light output apparatus 100. Further, the six photoelectric conversion cells of the photoelectric conversion element 420 have band gaps that enable efficient absorption of laser beams of the respective wavelengths. In this case, the wavelengths of laser light emitted from the laser light sources of the light output apparatus 100 are slightly larger than wavelengths corresponding to the respective band gaps of the photoelectric conversion cells included in the photoelectric conversion element 420 of the light receiving apparatus 200.

Further, in the photoelectric conversion element 420, the thickness of each of the photoelectric conversion cells, which serve as light absorbing layers, is adjusted, in order to prevent light having a wavelength assigned to a corresponding photoelectric conversion cell from being transmitted through the corresponding photoelectric conversion cell and being absorbed in a lower-side photoelectric conversion cell located below the corresponding photoelectric conversion cell. In addition, in order to prevent light, expected to be absorbed in a corresponding photoelectric conversion cell, from being absorbed in an upper-side photoelectric conversion cell located above the lower-side photoelectric conversion cell, the band gap of a material of the corresponding photoelectric conversion cell is smaller than the band gap of a material of the upper-side photoelectric conversion cell, by 50 meV or more, and further by 100 meV or more. In the third embodiment, the band gap of a material of a lower-side photoelectric conversion cell is smaller, by 80 meV, than the band gap of a material of an upper-side photoelectric conversion cell located above the lower-side photoelectric conversion cell.

Further, the photoelectric conversion element 420 illustrated in FIG. 6 may be a septuple-junction solar cell by forming an AlGaInP (2.02 eV) cell (not illustrated) on the GaInP cell (1.92 eV) 427 of the photoelectric conversion element 420, namely on the light incident side of the photoelectric conversion element 420 via a tunnel junction layer. In this case, the wavelength of laser light absorbed in the AlGaInP cell is preferably approximately 608 nm. However, the above configuration would be difficult for the GaAs-based multi-junction solar cell. Therefore, a GaN-based material and a semiconductor laser having a wavelength of 450 nm or 530 nm may be used.

In the multi-junction solar cell according to the third embodiment, the photoelectric conversion cells are connected in series, and the absorbing wavelength range is divided for optical to electrical power conversion. The current of the multi-junction solar cell according to the third embodiment is limited by a current value of a photoelectric conversion cell that generates the smallest current amount. If sunlight is used as a light source, the solar spectrum changes throughout the day, and also changes with the weather conditions, location, and time. For this reason, as the number of divided wavelengths and the number of junctions increase, a multi-junction solar cell that receives sunlight would be more susceptible to changes in solar spectrum, and more readily affected by variations in the amount of current generated in each of the photoelectric conversion cell. Conversely, in the power transmission system according to the third embodiment, even if the number of photoelectric conversion cells (junctions) increases, light outputs of respective laser light sources can be adjusted and optimized. Therefore, unlike the multi-junction solar cell that receives sunlight, in the power transmission system according to the third embodiment, an increase in the number of photoelectric conversion cells (junctions) works favorably, and the larger the number of junctions is, the more efficiently power can be transmitted. Further, as the number of junctions increases, the output voltage increases and the output current decreases. Thus, the amount of heat generated ($I^2R$) is reduced. Accordingly, even if higher power light is emitted, power can be generated with high efficiency.

Details other than the above are similar to those of the first embodiment.

Fourth Embodiment

Next, a fourth embodiment will be described. According to the fourth embodiment, the light receiving unit 210 of the light receiving apparatus 200 includes a condenser element 230 on a light incident side of the photoelectric conversion element 220, and also includes a heat sink 231 on a Ge substrate side of the photoelectric conversion element 220 opposite to the light incident side.

The condenser element 230 may be a condenser lens, for example. The condenser element 230 condenses laser light emitted from the light output unit 110, such that the condensed laser light is incident on the photoelectric conversion element 220.

In the light receiving apparatus 200, the area of the multi-junction solar cell, which is the photoelectric conversion element 220, is preferably as small as possible in terms of costs. Therefore, there may be a case in which the area of the multi-junction solar cell may be smaller than a cross-section of laser light emitted from the light output unit 110 of the light output apparatus 100. However, in the present embodiment, even if the light receiving area of the multi-junction solar cell is small, laser light is condensed by the condenser element 230 and enters the multi-junction solar cell. In this way, laser light emitted from the light output unit 110 of the light output apparatus 100 can enter the multi-junction solar cell.

Note that it is preferable to collimate laser light emitted from the light output unit 110 of the light output apparatus 100. However, if the light output apparatus 100 and the light receiving apparatus 200 are located away from each other, the laser beams may spread before entering the multi-junction solar cell. In the fourth embodiment, even if laser beams are spread, the spread laser beams can be condensed by the condenser element 230 such as a condenser lens and enter the multi-junction solar cell. Further, in order to decrease the optical density of laser light emitted from the light output unit 110 of the light output apparatus 100 for safety purposes, there may be a case in which the cross-sectional area of the laser light may be intentionally increased. Even in such a case, in the fourth embodiment, laser light can be condensed by the condenser element 230 such as a condenser lens and can enter the multi-junction solar cell. Further, in this case, even if the energy density of laser light emitted from the light output unit 110 is less than 1 sun (1 kW/m$^2$), the condenser element 230 such as a condenser lens allows the energy density of laser light entering the photoelectric conversion element 220 of the light receiving apparatus 200 to be 1 sun (1 kW/m$^2$) or more.

Further, in the fourth embodiment, laser light is condensed by the condenser element 230 such as a condenser lens and enters the multi-junction solar cell, thereby allowing laser light of high optical density to enter the multi-junction solar cell. For this reason, the temperature of the multi-junction solar cell may increase, and it may be required to dissipate heat. Therefore, the heat sink 231 is provided on the side of the photoelectric conversion element 220 opposite to the light incident side, in order to dissipate heat generated in the photoelectric conversion element 220.

The area of the multi-junction solar cell is relatively small. Therefore, bonding the heat sink 231 having an area larger than the area of the multi-junction solar cell to the multi-junction solar cell allows heat generated in the multi-junction solar cell to spread throughout the heat sink 231 and to be dissipated. Accordingly, heat can be efficiently dissipated.

Figure 8:
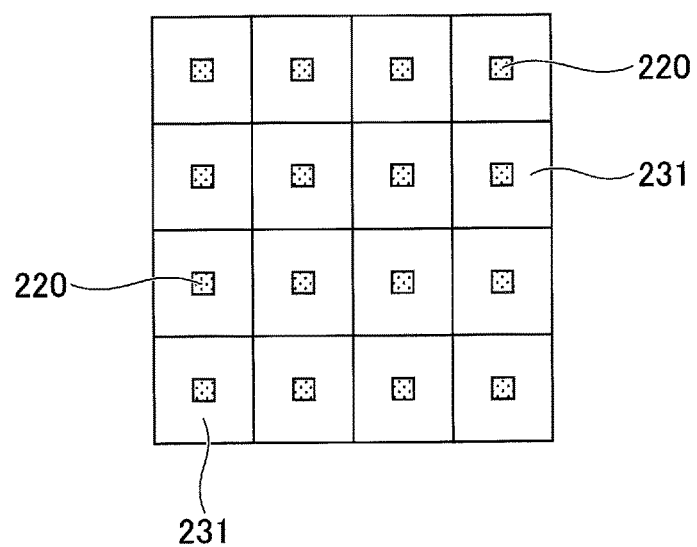
FIG. 8 is a diagram illustrating two-dimensionally arranged light receiving units according to the fourth embodiment.

Further, FIG. 8 illustrates a plurality of light receiving units 210 arranged in an array. In FIG. 8, the plurality of light receiving units 210 are viewed from a direction in which light enters. The condenser element 230 is not depicted in FIG. 8. As illustrated in FIG. 8, the plurality of light-condensing-type light receiving units 210 may be two-dimensionally arranged. For example, the plurality of light-condensing-type light receiving units 210 including photoelectric conversion elements 220 and condenser elements 230 may be two-dimensionally arranged. That is, a plurality of pairs of photoelectric conversion elements 220 and condenser elements 230 may be provided. Further, the plurality of light-condensing-type light receiving units 210 may be one-dimensionally arranged, namely arranged in a line. With the above configuration, the plurality of photoelectric conversion elements 220 of the respective light-condensing-type light receiving units 210 can receive incident light beams. With one pair of a condenser element and a photoelectric conversion element, there would be limitations on heat dissipation. Conversely, with the configuration illustrated in FIG. 8, the plurality of photoelectric conversion elements, which generate heat, are separately arranged, thus enabling efficient heat dissipation.

Details other than the above are similar to those of the first embodiment. Note that the features in the fourth embodiment may be applied to the features in the second embodiment and the features in the third embodiment.

Fifth Embodiment

Figure 9:
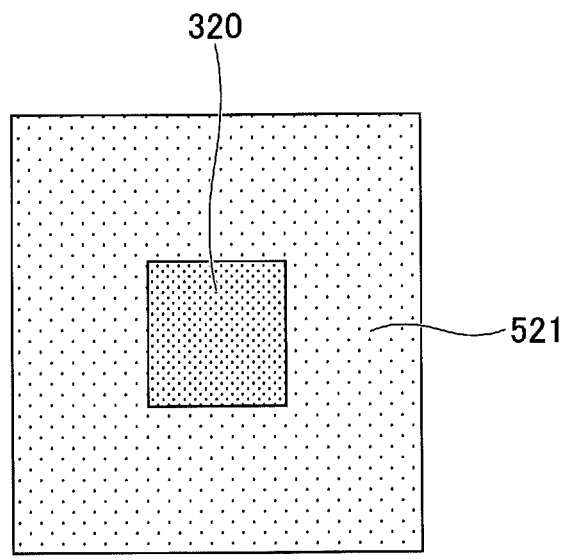
FIG. 9 is a diagram illustrating a light receiving unit of a power transmission system according to a fifth embodiment.

Next, a fifth embodiment will be described. In the fifth embodiment, as illustrated in FIG. 9, the light receiving unit 210 of the light receiving apparatus 200 has a configuration in which an auxiliary photoelectric conversion element 521 formed of Si is provided around a photoelectric conversion element 320, which is a compound semiconductor multi-junction solar cell. FIG. 9 is a schematic view of the photoelectric conversion element 320 and the auxiliary photoelectric conversion element 521 viewed from a direction in which light enters. The auxiliary photoelectric conversion element 521 is formed of a material having a band gap smaller than or equal to the smallest band gap of a photoelectric conversion cell, among photoelectric conversion cells constituting the multi-junction solar cell which is the photoelectric conversion element 320. The auxiliary photoelectric conversion element 521 is a single-junction solar cell. Specifically, in the fifth embodiment, the auxiliary photoelectric conversion element 521 is a Si (1.1 eV) solar cell whose band gap is smaller than that of GaAs. Note that the material of the auxiliary photoelectric conversion element 521 is not limited to Si, and the auxiliary photoelectric conversion element 521 may be formed of GaAs, for example.

Figure 10:
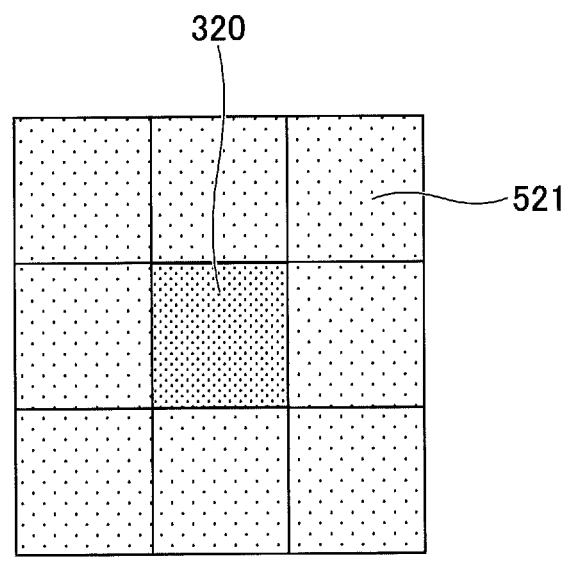
FIG. 10 is a diagram illustrating a first variation of the light receiving unit of the power transmission system according to the fifth embodiment.
Figure 11:
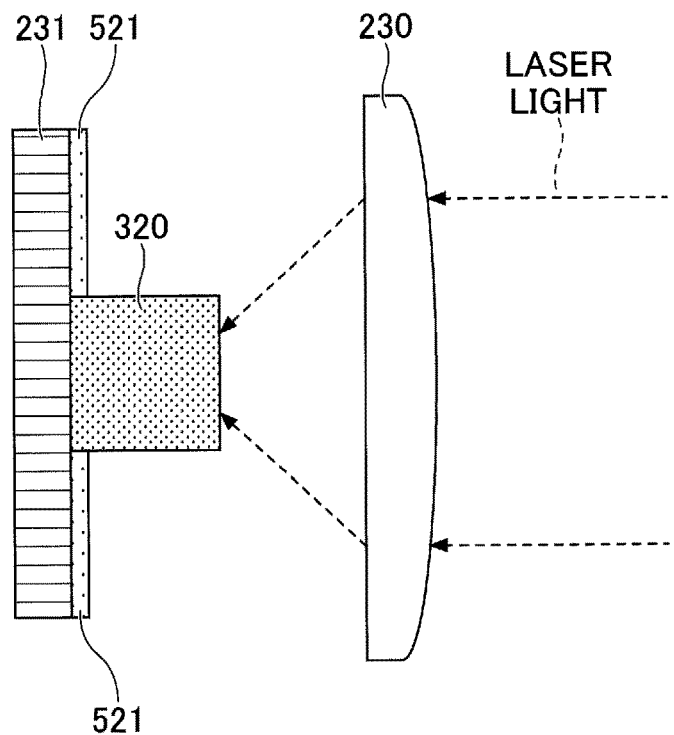
FIG. 11 is a diagram illustrating a second variation of the light receiving unit of the power transmission system according to the fifth embodiment.

In the fifth embodiment, the photoelectric conversion element 320 may be provided on the auxiliary photoelectric conversion element 521. Alternatively, as illustrated in FIG. 10, a plurality of auxiliary photoelectric conversion elements 521 may be provided so as to surround the photoelectric conversion element 320. Further, the photoelectric conversion element 320 may be provided with a condenser element, but is not necessarily provided with a condenser element. If the photoelectric conversion element 320 is provided with a condenser element, ambient light such as scattered light from the sun can be received. Further, as illustrated in FIG. 11, the auxiliary photoelectric conversion element 521 may be provided on the heat sink 231 so as to surround an area where the photoelectric conversion element 320 is bonded to the heat sink 231. Alternatively, the photoelectric conversion element 320 may be provided on the auxiliary photoelectric conversion element 521, and the auxiliary photoelectric conversion element 521 may be provided on the heat sink 231. Of course, as in the example of FIG. 8, a plurality of photoelectric conversion elements 320 may be two-dimensionally arranged.

The light output unit 110 of the light output apparatus 100 emits laser light toward the photoelectric conversion element 320 of the light receiving apparatus 200, but some of the laser light may be emitted outside the photoelectric conversion element 320. In this case, some of the laser light emitted outside the photoelectric conversion element 320 would not be converted into electrical power. In light of the above, in the fifth embodiment, the auxiliary photoelectric conversion element 521 is provided around the photoelectric conversion element 220, such that some laser light emitted outside the photoelectric conversion element 220 can be absorbed in the auxiliary photoelectric conversion element 521 and converted into the electrical power.

The auxiliary photoelectric conversion element 521 is formed of a material having a band gap smaller than or equal to the smallest band gap of a photoelectric conversion cell, among photoelectric conversion cells constituting the multi-junction solar cell, which is the photoelectric conversion element 320. Accordingly, although there is still energy loss due to the band gap difference, laser beams of all wavelengths emitted from the light output unit 110 can be absorbed in the photoelectric conversion element 320 and the auxiliary photoelectric conversion element 521, and converted into electrical power. When the auxiliary photoelectric conversion element 521 is provided around the photoelectric conversion element 320, power transmission efficiency can be improved, as compared to when no auxiliary photoelectric conversion element 521 is provided. In addition, the auxiliary photoelectric conversion element 521 formed of Si requires a relatively low cost, even if the auxiliary photoelectric conversion element 521 has a wide area.

Details other than the above are similar to those of the first embodiment. Note that the features in the fifth embodiment may be applied to the features in the second embodiment and the features in the third embodiment.

Sixth Embodiment

Figure 12:
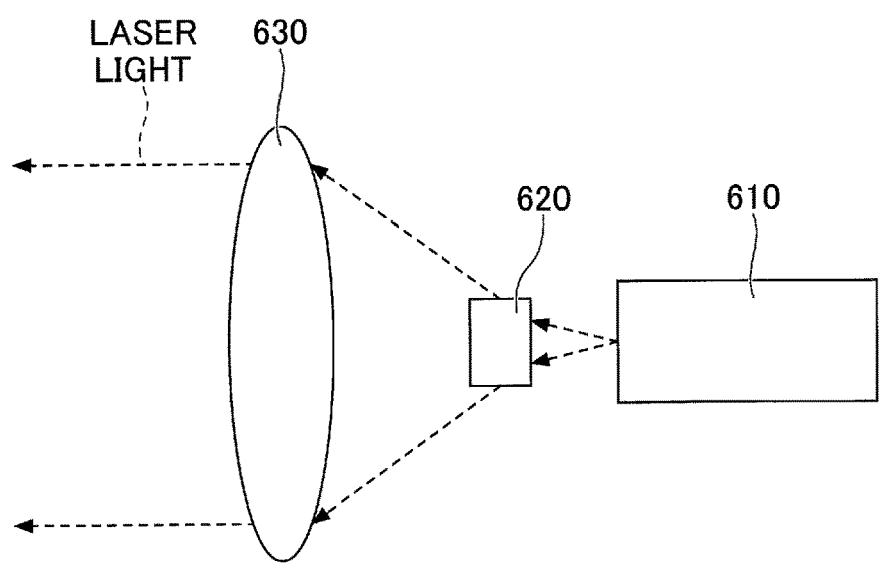
FIG. 12 is a diagram illustrating a light output unit of a power transmission system according to a sixth embodiment.

Next, a sixth embodiment will be described. In the sixth embodiment, as illustrated in FIG. 12, in order to allow light to propagate in the space while ensuring safety, an optical element 620 for improving eye safety of light emitted from a light source 610 is provided near a light emitting side of the light source 610. For example, the light source 610 may be a laser light source included in the light output unit 110. Specifically, an optical element 630 such as a lens that collimates and propagates light emitted from the light source 610 is provided, and the optical element 620 for improving eye safety is provided closer to the light source 610 between the light source 610 and the optical element 630. For example, the optical element 620 may be a diffusion plate or a diffraction optical element that, if laser light is used, decreases optical density, scatters, diffuses, or disperses the laser light, or controls luminance distribution, in order to reduce the degree of coherence of the laser light. Accordingly, light emitted from the light source 310 can propagate in the space with eye-safe energy density, and further, the upper limit of the light output can be increased.

In the above case, the light receiving apparatus 200 preferably includes the condenser element 230 as described in the fourth embodiment. When the condenser element 230 is included, the area of the photoelectric conversion element 220 can be reduced. Accordingly, light that has been spread in order to ensure eye safety as described above can be condensed by the light receiving unit 210, and the condensed light flux can enter the photoelectric conversion element 220 having an area smaller than the light flux. Further, as in the example of FIG. 8, by providing a two-dimensionally or one-dimensionally arranged plurality of light receiving units 210, it is possible to transmit high-power light while also ensuring eye safety. Further, as in the fifth embodiment, the auxiliary solar cell 521 may also be used.

Although the embodiments have been specifically described above, the present invention is not limited to the specific embodiments, and numerous variations and modifications may be made without departing from the scope of the present invention.

What is claimed is:

1. A power transmission system comprising:
    a light output apparatus; and
    a light receiving apparatus,
    the light output apparatus including
        a plurality of light sources having different wavelengths,
        a light output control unit configured to control light outputs of the plurality of light sources; and
        a plurality of power sources, each power source among the plurality of power sources supplying electrical power to a respective light source among the plurality of light sources; and
    the light receiving apparatus including a photoelectric conversion element configured to absorb light beams emitted from the plurality of light sources, and convert the absorbed light beams into electrical power,
    wherein the power transmission system is configured to:
        vary a current applied from a first power source among the plurality of power sources;
        monitor current output from the photoelectric conversion element while the current applied from the first power source is varied;
        select, among current values of the varied current, a lowest current value at which an amount of the monitored current is maximized; and
        set the selected lowest current value to a fixed current value of the first power source,
    wherein the light output control unit individually sets each of the light outputs of the plurality of light sources.

2. The power transmission system according to claim 1, wherein the photoelectric conversion element is formed by stacking a plurality of photoelectric conversion cells having different band gaps, and
    each of the plurality of photoelectric conversion cells forming the photoelectric conversion element absorbs a light beam of a corresponding wavelength, among the light beams emitted from the plurality of light sources.

3. The power transmission system according to claim 1, wherein the light output control unit makes the selection and individually sets each of the light outputs of the plurality of light sources, based on current amounts obtained in the photoelectric conversion element.

4. The power transmission system according to claim 1, wherein the light receiving apparatus includes a light reception control unit that makes the selection.

5. The power transmission system according to claim 1, wherein the light output apparatus includes a light-output-side communication unit, and the light receiving apparatus includes a light-receiving-side communication unit, and
    the light output control unit controls the light outputs of the plurality of light sources, based on information transmitted from the light-receiving-side communication unit to the light-output-side communication unit.

6. The power transmission system according to claim 1, wherein energy density of each of the light beams emitted to the photoelectric conversion element is greater than or equal to 1 kW/m$^2$.

7. The power transmission system according to claim 1, wherein ambient light enters the photoelectric conversion element, in addition to the light beams emitted from the plurality of light sources, and
    the light output control unit individually sets each of the light outputs of the plurality of light sources, in accordance with a change in the ambient light.

8. The power transmission system according to claim 1, wherein the light output apparatus includes
    an alignment imaging unit configured to identify the light receiving apparatus and locate a position of the light receiving apparatus,
    an alignment light source configured to emit an alignment light beam, and
    an angle adjusting unit configured to adjust a direction of the alignment light beam emitted from the alignment light source and of the light beams emitted from the plurality of light sources,
    wherein the light receiving apparatus includes
    an alignment light receiving element configured to receive the alignment light beam emitted from the alignment light source, and
    wherein the light output control unit causes the angle adjusting unit to adjust the emission direction of the alignment light beam so as to maximize a current amount generated in the alignment light receiving element.

9. The power transmission system according to claim 1, wherein each of the plurality of light sources is a semiconductor laser.

10. The power transmission system according to claim 1, further comprising an optical element, for improving eye safety of the light beams emitted from the plurality of light sources, the optical element being disposed near a light emitting side of the plurality of light sources.

11. The power transmission system according to claim 1, wherein the light receiving apparatus includes a condenser element configured to condense the light beams emitted from the plurality of light sources, such that the condensed light beams are incident on the photoelectric conversion element.

12. The power transmission system according to claim 11, wherein the light receiving apparatus includes a plurality of pairs of photoelectric conversion elements and condenser elements.

13. The power transmission system according to claim 1, further comprising an auxiliary photoelectric conversion element disposed around the photoelectric conversion element.

14. The power transmission system according to claim 13, wherein the photoelectric conversion element is formed by a plurality of photoelectric conversion cells, and the auxiliary photoelectric conversion element is formed of, a material having a band gap smaller than or equal to a smallest band gap of a photoelectric conversion cell of the plurality of photoelectric conversion cells.

15. A light output apparatus for irradiation of a light receiving apparatus with light beams, the light receiving apparatus including a photoelectric conversion element configured to convert the light beams into electrical power, the light output apparatus comprising:

a plurality of light sources having different wavelengths, a light output control unit configured to control light outputs of the plurality of light sources, and a plurality of power sources, each power source among the plurality of power sources supplying electrical power to a respective light source among the plurality of light sources;

wherein the light output control unit, is configured to:
vary a current applied from a first power source among the plurality of power sources;
receive information on monitored current output from the photoelectric conversion element while the current applied from the first power source is varied;
select, among current values of the varied current a lowest current value at which an amount of the monitored current is maximized; and
set the selected lowest current value to a fixed current value of the first power source;
wherein the light output control unit individually sets each of the light outputs of the plurality of light sources.

16. The light output apparatus according to claim 15, wherein the photoelectric conversion element is formed by stacking a plurality of photoelectric conversion cells having different band gaps, and
each of the plurality of photoelectric conversion cells forming the photoelectric conversion element absorbs a light beam of a corresponding wavelength, among the light beams emitted from the plurality of light sources.

17. The light output apparatus according to claim 15, wherein the light output control unit individually sets each of the light outputs of the plurality of light sources, based on current amounts obtained in the photoelectric conversion element.

18. A light receiving apparatus for reception of light beams emitted from a plurality of light sources of a light output apparatus, the plurality of light sources having different wavelengths, the light receiving apparatus comprising;
a photoelectric conversion element formed by stacking a plurality of photoelectric conversion cells and configured to convert the light beams into electrical power, the plurality of photoelectric conversion cells having different band gaps, and each absorbing a light beam of a corresponding wavelength, among the light beams emitted from the plurality of light sources;
a light reception control unit configured to:
monitor current output from the photoelectric conversion element while current that drives a first light source among the plurality of light sources is varied; and
select, among current values of the varied current, a lowest current value at which an amount of the monitored current is maximized; and
a light-receiving-side communication unit configured to transmit information on the lowest current value to the light output apparatus.

19. A power transmission method, the method comprising;
varying a current applied from a first power source among a plurality of power sources that power a light output apparatus;
monitoring current output from a photoelectric conversion element while the current applied from the first power source is varied, wherein the photoelectric conversion element is contained within a light receiving apparatus;
selecting, among current values of the varied current, a lowest current value at which an amount of the monitored current is maximized; and
setting the selected lowest current value to a fixed current value of the first power source.

* * * * *